United States Patent
Takahashi et al.

[11] Patent Number: 5,900,106
[45] Date of Patent: May 4, 1999

[54] BONDING APPARATUS

[75] Inventors: Kuniyuki Takahashi, Musashimurayama; Hideya Nakamura, Oume, both of Japan

[73] Assignee: Kabushiki Kaisha Shinkawa, Tokyo, Japan

[21] Appl. No.: 08/977,708

[22] Filed: Nov. 25, 1997

[30] Foreign Application Priority Data

Nov. 29, 1996 [JP] Japan ..................................... 8-334911

[51] Int. Cl.$^6$ .............................. B05B 5/00; B32B 31/00; G06K 9/00; B23B 37/00
[52] U.S. Cl. .......................... 156/356; 156/363; 156/378; 156/379; 382/145; 382/151; 382/152; 228/4.5; 228/105; 228/180.5
[58] Field of Search ...................... 382/145, 146, 382/147, 148, 149, 150, 151, 152, 153, 154; 156/350, 358, 363, 378, 379; 228/1.1, 4.5, 105, 110.1, 111.5, 180.5

[56] References Cited

U.S. PATENT DOCUMENTS

| | | | |
|---|---|---|---|
| 5,501,388 | 3/1996 | Takeuchi | 228/1.1 |
| 5,667,130 | 9/1997 | Morita et al. | 228/110.1 |
| 5,720,424 | 2/1998 | Takeuchi | 228/4.5 |

FOREIGN PATENT DOCUMENTS 7-147297  6/1995  Japan.

Primary Examiner—David A. Simmons
Assistant Examiner—J. A. Lorengo
Attorney, Agent, or Firm—Koda & Androlia

[57] ABSTRACT

In a wire bonding apparatus in which images of workpieces placed on a heating block so as to be bonded are taken by a camera through an optical path housing in which an optical path from the workpiece to the camera is established, heaters are installed on the optical path housing so as to heat the optical path housing at a constant temperature which is higher than the temperature that is affected by the heating block.

2 Claims, 1 Drawing Sheet

BONDING APPARATUS

BACKGROUND OF THE INVENTION

1. Field of the Invention

The present invention relates to a bonding apparatus such as a wire bonding apparatus, die bonding apparatus or tape bonding apparatus and more particularly to a bonding apparatus that includes a means which takes images of a workpiece to be bonded.

2. Prior Art

A bonding apparatus is generally equipped with a heating block which heats the semiconductor workpieces and a bonding tool which performs bonding on the semiconductor workpieces along with a camera and an optical path housing which are used to obtain the images of the semiconductor workpieces.

In order to perform high precision bonding with such a bonding apparatus, it is necessary to specifically recognize the positions of the semiconductor workpieces. Meanwhile, in order to shorten the time which the bonding tool takes to move to perform bonding, it is necessary to shorten the distance between the bonding point for each semiconductor workpiece and the recognition point where the semiconductor workpiece is recognized.

Accordingly, the bonding tool and the optical path housing are installed in close proximity to each other. However, this means that the optical path housing is installed in close proximity to the semiconductor workpiece. As a result, the optical path housing is in an environment of radiant heat or a high-temperature atmosphere, etc. generated in the vicinity of the semiconductor workpiece, which is heated to a high temperature by the heating block.

Since the camera is generally designed so as to work at room temperatures, when the optical path housing is exposed to such a heated environment, thermal expansion occurs therein, and a positional deviation tends to occur in the optical path housing during the object recognition or image obtaining process.

One example of a conventional means for preventing thermal expansion of the optical path housing is to blow cooling air onto the optical path housing, and this is disclosed in Japanese Patent Application Laid-open (Kokai) No. H7-147297.

Generally, the optical path housing, which is connected to the camera, is installed on an XY table, and it may be positioned above the heating block during the process of recognizing the semiconductor workpiece. On the other hand, the optical path housing may be positioned away from the heating block when the type of workpiece to be handled is changed.

Accordingly, in the prior art described above, periodic or irregular heat changes inevitably occur in the optical path housing as a result of repeated heating, which is when the optical path housing is moved near the heat source, and as a result of cooling, which when the optical path housing is moved away from the heat source and when cooling air is blown thereon. As a result, an unexpected positional shift in the recognition position occurs due to the deformation of the optical path housing. In addition, deterioration in the parts of the optical path housing progresses rapidly. Furthermore, even if cooled by the cooling air, if automatic operation is initiated while the optical path housing is at room temperature, thermal expansion of the optical path housing gradually proceeds, so that the recognition results obtained after several hours of automatic operation differ from those obtained immediately after the initiation of automatic operation.

SUMMARY OF THE INVENTION

Accordingly, the object of the present invention is to provide a bonding apparatus in which deformation which caused by the heat changes of the optical path housing is suppressed, thus preventing a shift in the image recognition position and avoiding early deterioration of the constituting elements of the optical path housing.

The above object is accomplished by a unique structure for a bonding apparatus in which images of semiconductor workpieces placed and carried on a heating block are taken by means of a camera through an optical path housing, wherein a heating means is installed on at least the optical path housing so as to maintain the temperature of the optical path housing at a constant value.

DETAILED DESCRIPTION OF THE INVENTION

Figure 1:
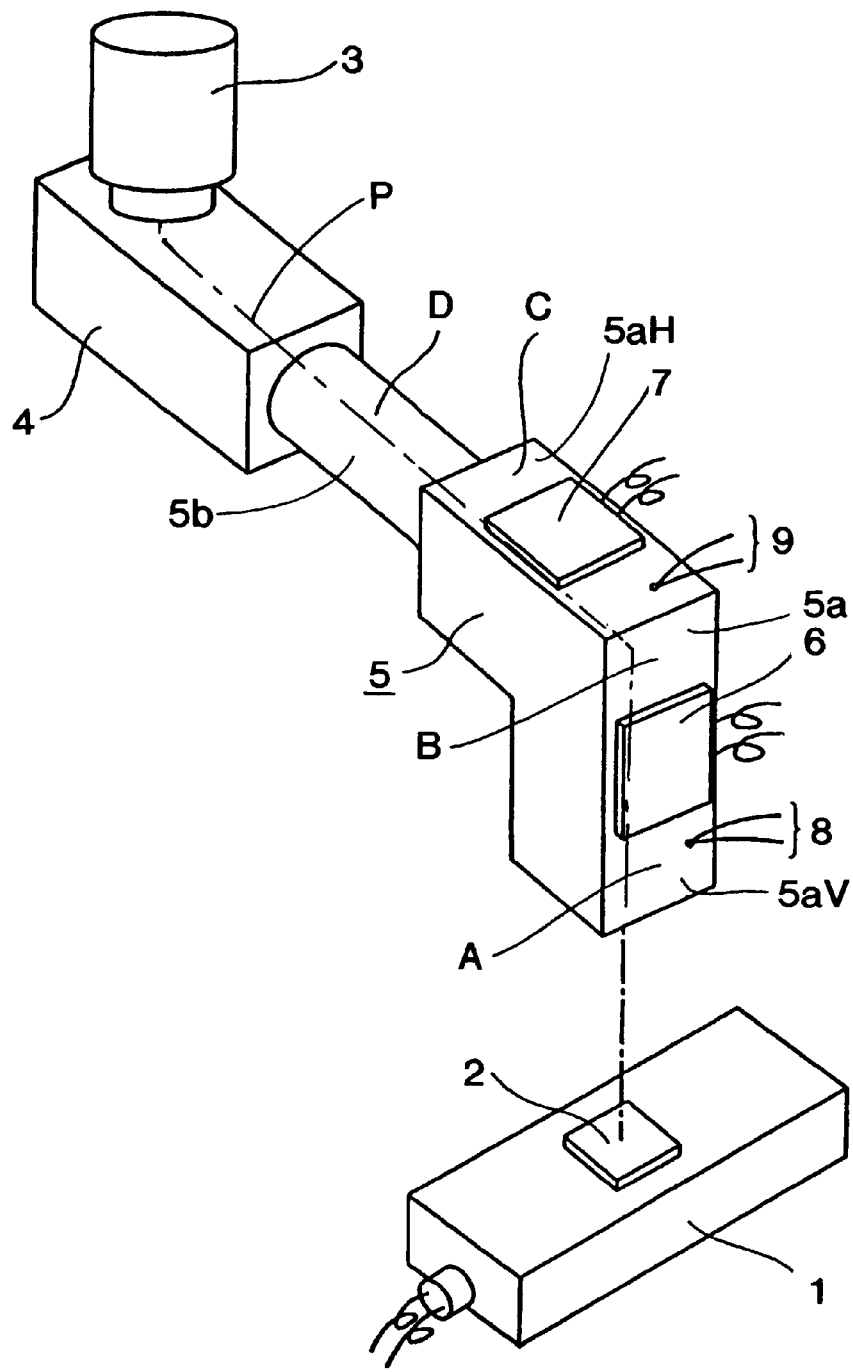
FIG. 1 is a perspective view which illustrates the essential portion of one embodiment of the bonding apparatus of the present invention.

In FIG. 1, a semiconductor workpiece 2 is placed on a heating block I.

A camera supporting arm 4 to which a camera 3 is attached is fastened to a bonding head (not shown) which is driven in the X and Y directions, and an optical path housing 5 is fastened to this camera supporting arm 4. The optical path housing 5 is comprised of an angled main housing 5a and a tubular member 5b; and the angled main housing 5a includes a horizontal section 5a H and a vertical section 5a V. With this structure, recognized images of the semiconductor workpiece 2 are introduced into the camera 3 along the optical path P which is provided in the optical path housing 5 and camera supporting arm 4.

In addition, a plurality of heaters 6 and 7 and temperature-sensing elements 8 and 9 (such as CA wires, etc.) are mounted on the optical path housing 5. The wiring of the heaters 6 and 7 and the temperature-sensing elements 8 and 9 are connected to a temperature controller (not shown).

The optical path housing 5 is heated by supplying electric power to the heaters 6 and 7. The heating temperature of the heaters 6 and 7 is controlled so that the optical path housing 5 is heated, when it is positioned above the heating block 1, to a temperature which is higher than the temperature at which the optical path housing 5 is heated by high-temperature atmosphere or radiant heat from the heating block 1, etc.

A test shows that in a case, for instance, where the temperature of the heating block 1 is 280° C., and the lower edge of the vertical section 5a V of the optical path housing 5 is positioned approximately 10 mm above the heating block 1, then the optical path housing 5 heated by the high-temperature atmospheres and radiant heat from the heating block 1, etc. at points A through D thereof were as follows: point A: 57° C., point B: 40° C., points C and D: 36° C. Accordingly, in such a case, it is controlled so that the optical path housing 5 is heated by the heater 6 to be greater than 57° C. (60° C., for instance) at point A; and the optical path housing 5 is further heated by the heater 7 to be greater than 36° C. (40° C., for instance) at point C.

In operation, the optical path housing 5 is heated beforehand by the heaters 6 and 7. The respective heating temperatures in this case are, as described above, controlled so that the optical path housing 5 is heated to respective temperature values that are higher than the temperature values at which the optical path housing 5 is heated by the high-temperature atmosphere and radiant heat from the heating block, etc. Accordingly, the optical path housing 5 is not affected by the high-temperature atmosphere and radiant heat and kept at a constant temperature by the heaters 6 and 7; and therefore, the expansion of the optical path housing 5 is stabilized, and the shift in the recognition position can be suppressed.

Furthermore, since the temperature-sensing elements 8 and 9 are provided in the respective vicinities of the heaters 6 and 7, the temperature of the camera mirror tube 5 are monitored by these temperature-sensing elements 8 and 9. In addition, the heating temperature by the heaters 6 and 7 is controlled by a heat controller (not shown) so that the heating temperature by the heaters 6 and 7 is maintained at a desired temperature. Thus, dimensional changes in the expansion of the optical path housing 5 can be kept to a minimum.

In the above embodiment, the heaters 6 and 7 and temperature-sensing elements 8 and 9 are installed only on the optical path housing 5; however, it goes without saying that heaters and temperature-sensing elements can be installed on the camera supporting arm 4 as well.

As seen from the above, according to the present invention, since a heating means is installed on the optical path housing, deformation of the optical path housing that is caused by heat changes in the optical path housing can be suppressed, a positional shift in the image recognition position can be prevented, and an early deterioration of the constituting elements can be prevented.

What is claimed is:

1. A bonding apparatus in which images of work pieces positioned and placed on a heating block are recognized by a camera and related optical path housing comprising:

a camera supporting means on which is supported a camera, said camera supporting means with supported camera being fastened to a bonding head which is driven in the X and Y directions;

an optical path housing means fastened to said camera supporting means, said optical path housing means forming an optical path between said camera supported on said camera supporting means and said work pieces positioned on said heating block;

said optical path housing means further comprising a heating means mounted on said optical path housing means, said heating means acting to maintain said optical path housing means at a constant temperature.

2. The bonding apparatus according to claim 1 wherein said heating means mounted on said optical path housing means acts to maintain said optical path housing means at a constant temperature which is higher than a temperature it would be heated by said heating block.

* * * * *